United States Patent [19]

Yen et al.

[11] Patent Number: 6,156,597
[45] Date of Patent: Dec. 5, 2000

[54] ADDITIONAL BUFFER LAYER FOR ELIMINATING OZONE/ TETRAETHYLORTHOSILICATE SENSITIVITY ON AN ARBITRARY TRENCH STRUCTURE

[75] Inventors: Wen-Ping Yen; Chia-Lin Ku, both of Hsinchu; Chong-Che Lee, Taichung, all of Taiwan

[73] Assignees: ProMOS Technologies, Inc.; Mosel Vitelic, Inc., both of Hsinchu, Taiwan; Siemens AG, Munich, Germany

[21] Appl. No.: 09/094,347

[22] Filed: Jun. 9, 1998

[51] Int. Cl.[7] .............................................. H01L 21/8242
[52] U.S. Cl. .................. 438/221; 438/245; 438/244; 438/242; 438/239; 438/243; 438/240; 438/254; 438/253
[58] Field of Search ..................... 438/221, 245, 438/242, 244, 239, 243, 240, 254, 253

[56] References Cited

U.S. PATENT DOCUMENTS

| | | |
|---|---|---|
| 5,158,905 | 10/1992 | Ahn . |
| 5,213,992 | 5/1993 | Lu . |
| 5,256,587 | 10/1993 | Jun et al. . |
| 5,302,540 | 4/1994 | Ko et al. . |
| 5,332,696 | 7/1994 | Kim et al. . |
| 5,350,707 | 9/1994 | Ko et al. . |
| 5,424,253 | 6/1995 | Usami et al. ............................ 437/238 |
| 5,427,974 | 6/1995 | Lur et al. . |
| 5,459,095 | 10/1995 | Huang et al. . |
| 5,466,627 | 11/1995 | Lur et al. . |
| 5,482,882 | 1/1996 | Lur et al. . |
| 5,482,885 | 1/1996 | Lur et al. . |
| 5,492,848 | 2/1996 | Lur et al. . |
| 5,512,768 | 4/1996 | Lur et al. . |
| 5,525,551 | 6/1996 | Ohta ....................................... 437/238 |
| 5,626,924 | 5/1997 | Ishikawa ................................ 427/579 |
| 5,644,151 | 7/1997 | Izumi et al. ............................ 257/306 |
| 5,731,241 | 3/1998 | Jang et al. ............................. 438/424 |
| 5,946,542 | 8/1999 | Iyer ............................................. 438/7 |
| 5,946,799 | 9/1999 | Yamamoto et al. ..................... 29/852 |
| 6,009,827 | 1/2000 | Robles et al. .......................... 118/723 |

OTHER PUBLICATIONS

Y.K. Jun, S.K. Rha, S.C. Kim, J.S. Roh, W.S. Kim & H.G. Lee, The Fabrication and Electrical Properties of Modulated Stacked Capacitor for Advanced DRAM Application, IEEE Elec. Dev. Letters, vol. 13, No. 8, Aug., 1992, pp. 430–432.

*Primary Examiner*—Carl Whitehead, Jr.
*Assistant Examiner*—James Park
*Attorney, Agent, or Firm*—Proskauer Rose LLP

[57] ABSTRACT

A method of fabricating a semiconductor device is provided including the steps of:

(a) forming one or more protrusions on a semiconductor surface, (b) forming a first $O_x$/TEOS film on top and side surfaces of the protrusions and surface area portions of the semiconductor surface separating the protrusions from each other, if any, and (c) forming a second $O_3$/TEOS film on, and covering, the first film.

Illustratively, the protrusions have nitride regions at their peaks. The first film can be a low pressure (e.g., 30–70 torr) $O_3$/TEOS film or a plasma enhanced chemical vapor deposition (PECVD) $O_2$/TEOS film. The second film is a high pressure (e.g., 200–600 torr) $O_3$/TEOS film.

The high pressure $O_3$/TEOS film avoids all of the disadvantages of the prior art. The low pressure $O_3$/TEOS film or PECVD $O_2$/TEOS film covers the nitride region of the protrusion so that the high pressure $O_3$/TEOS film will continuously cover the entire structure with a uniform thickness.

8 Claims, 1 Drawing Sheet

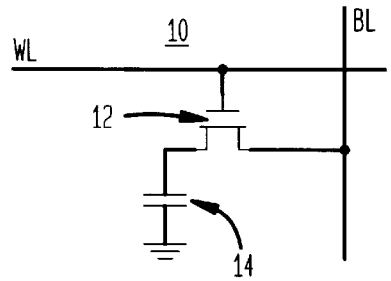
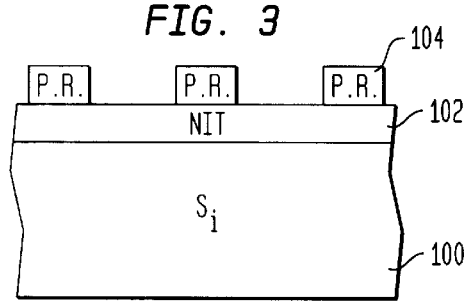
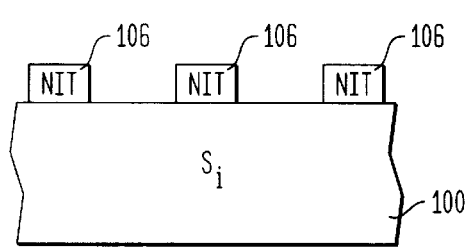
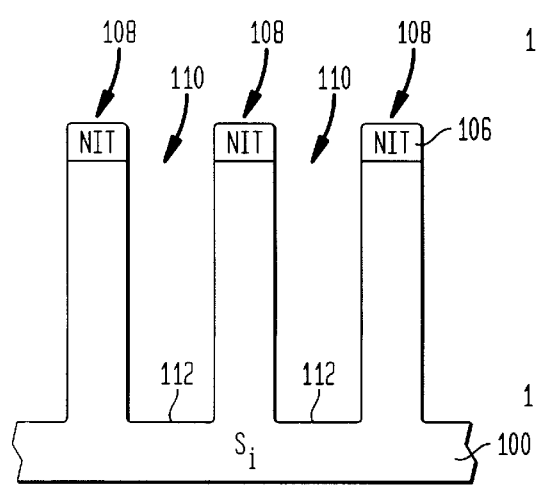
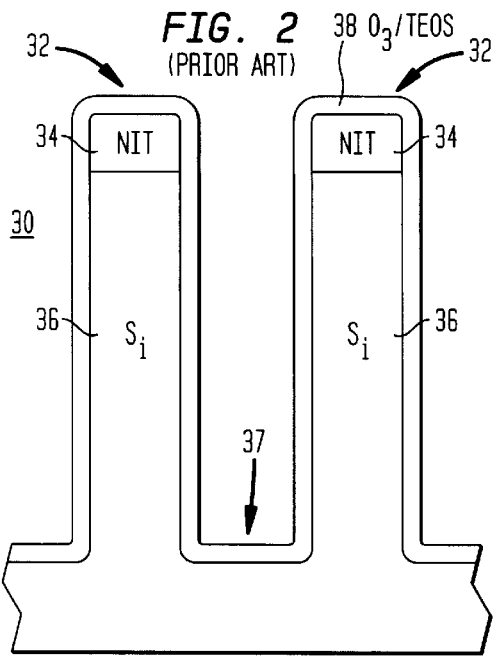
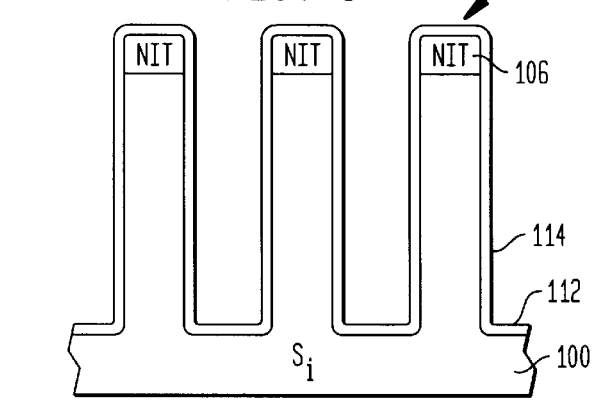
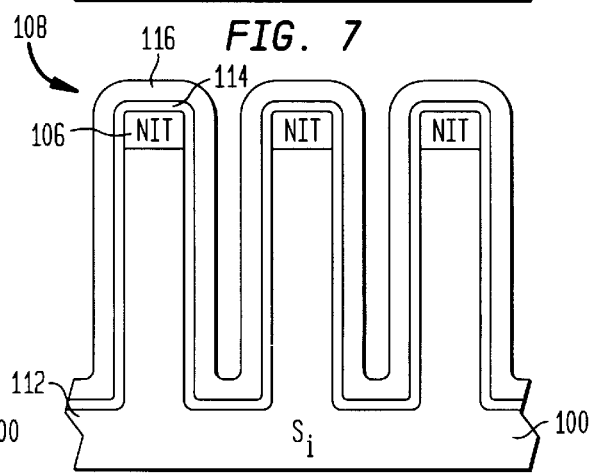

ADDITIONAL BUFFER LAYER FOR ELIMINATING OZONE/ TETRAETHYLORTHOSILICATE SENSITIVITY ON AN ARBITRARY TRENCH STRUCTURE

FIELD OF THE INVENTION

The present invention pertains to semiconductor manufacture. In particular, the invention pertains to constructing a surface with protrusions such as pillars or walls.

BACKGROUND OF THE INVENTION

This invention pertains to fabricating a semiconductor surface with one or more protrusions, such as pillars or walls. The invention is described in the context of its use as a surface shaping template/support structure for another surface, such as a capacitor plate.

FIG. 1 shows a conventional volatile memory cell 10 such as is used in a DRAM or SDRAM. Advantageously, a two-dimensional array of such cells 10 are provided which are organized into rows and columns. Each row of cells is provided with a word line and each column of cells is provided with one or more bit lines. Each cell is connected to the word line of the row, and at least one of the bit line(s) of the column, into which the cell 10 is organized. A particular cell is accessed (i.e., a bit is written thereto or read therefrom) by activating (i.e., applying a voltage to, or sensing a voltage on,) the word line and bit line(s) connected to the to-be-accessed cell. As shown in FIG. 1, the cell 10 illustratively comprises a switch, in the form of a MOSFET transistor 12. The gate of the MOSFET 12 is connected to the word line WL of the row containing the cell. The drain of the MOSFET 12 is connected to the bit line BL of the column containing the cell. Connected to the source of the MOSFET is a capacitor 14. By activating the word line WL and the bit line BL, a charge can be stored on, or removed from, the capacitor 14, or the particular charge of the capacitor 14 can be sensed.

It is desirable to increase the amount of charge that can be stored on the capacitor 14 of each cell. By increasing the charge stored on the capacitor 14, the correct logic value stored in the cell 10 can be more easily sensed. As is known, the amount of charge Q stored on the capacitor 14 is a function of the capacitance C of the capacitor 14 and the voltage V applied to the cell 10 during the writing operation (i.e., Q=CV). Generally speaking, the applied voltage is fixed, e.g., at 5 volts, 3.3. volts, etc.

The capacitance C, on the other hand, is a function of, amongst other things, the surface area of the capacitor plates. That is, the capacitance of the capacitor increases with increasing surface area of the capacitor plates. However, as device dimensions of the memory, in particular, the cells 10, are reduced, or the number of cells in the array are increased, or both, less planar surface area of the semiconductor die is available for allocation to the capacitor plate of each cell. To overcome this problem, the prior art has suggested several techniques for changing the geometry of the capacitor plates from planar, two-dimensional structures to non-planar, three-dimensional structures. See, e.g., U.S. Pat. Nos. 5,512,768, 5,492,848, 5,482,885, 5,482,882, 5,466,627, 5,459,095, 5,427,974, 5,350,707, 5,332,696, 5,302,540, 5,256,587, 5,213,992, 5,168,881, and 5,158,905; Y. K. Jun, S. K. Rha, S. C. Kim, J. S. Roh, W. S. Kim & H. G. Lee, *The Fabrication and Electrical Properties of Modulated Stacked Capacitor for Advanced DRAM Application*, IEEE ELEC. DEV. LETTERS, vol. 13, no. 8, Aug., 1992, p. 430–432.

FIG. 2 shows an illustrative template/support structure 30 which, for example, can be used in forming a capacitor plate with increased surface area. As shown, multiple protrusions (e.g., walls or pillars) 32 are formed in a substrate. Each protrusion 32 includes a nitride region 34, such as $Si_3N_4$, formed on a Si mesa 36. A low pressure (e.g., 40 torr) $O_3$/TEOS (ozone/tetraethylorthosilicate) film 38 is deposited on, and covers the top surface of, the nitride regions 34, the top surfaces of the substrate portions 37 separating the protrusions 32 and the side surfaces of the Si mesas 36 and nitride regions 34. A capacitor plate, e.g., of a doped polycrystalline Si, can then be formed on the $O_3$/TEOS film 38. The capacitor plate will have a three-dimensional surface that conforms to the surface of the top and side surfaces of the protrusions 32 of the template/support structure and separating substrate surface portions 37. Thus, for a given planar area of the semiconductor die, a capacitor plate can be formed with a larger surface area, and thus a larger capacitance C.

The use of the low pressure $O_3$/TEOS film 38 provides certain advantages such as relatively complete and uniform thickness coverage over the top and side surfaces of each protrusion 32 of the structure 30. However, the use of low pressure $O_3$/TEOS in the film 38 is also associated with certain disadvantages. For example, such a low pressure $O_3$/TEOS film 38 has a low water resistance. This means that the film 38 tends to absorb a large amount of water when exposed to air. This can change the geometry (size, shape) of the film 38 in an undesirable fashion. In addition, the low pressure $O_3$/TEOS film 38 has a high water content. Thus, if heated at a later time this water may boil out thereby damaging the structure 30 or other parts of the die. Furthermore, the low pressure $O_3$/TEOS film 38 is porous. At high temperatures, such as 1000° C. or higher, the film can shrink 11% or more. Likewise, the porous nature of the low pressure $O_3$/TEOS film 38 makes it etch at an uncontrollably high rate. For example, more than 10,000 Å/min are etched away in a BOE 7:1 (a buffered oxide etch using an etching agent, such as a mixture of 49% HF with $NH_4F$, at a volume ratio of 1 to 7).

It is an object of the present invention to overcome the disadvantages of the prior art.

SUMMARY OF THE INVENTION

This and other objects are achieved by the present invention. A method of fabricating a semiconductor device is provided including the steps of:

(a) forming one or more protrusions on a semiconductor surface, (b) forming a first $O_x$/TEOS film on top and side surfaces of the protrusions and surface area portions of the semiconductor surface separating the protrusions from each other, if any, and (c) forming a second $O_3$/TEOS film on, and covering, the first film.

Illustratively, the first film can be a low pressure (e.g., 30–70 torr) $O_3$/TEOS film or a plasma enhanced chemical vapor deposition (PECVD) $O_2$/TEOS film. The second film is a high pressure (e.g., 200–600 torr) $O_3$/TEOS film.

The high pressure $O_3$/TEOS film avoids all of the disadvantages of the prior art. The low pressure $O_3$/TEOS film or PECVD $O_2$/TEOS film covers the nitride region of the protrusion so that the high pressure $O_3$/TEOS film will continuously cover the entire structure with a uniform thickness.

BRIEF DESCRIPTION OF THE DRAWING

FIG. 1 shows a prior art volatile memory cell.

FIG. 2 shows a prior art semiconductor structure.

FIGS. 3–7 show a semiconductor fabrication process and produced structure according to an embodiment of the present invention.

DETAILED DESCRIPTION OF THE INVENTION

Heretofore, the problems associated with the low pressure $O_3$/TEOS insulative covering film of the Si protrusions has been difficult to solve. Most notably, a high pressure $O_3$/TEOS film does not adhere very well to the protrusions. In particular, studies have shown that as the pressure is raised in the deposition process, the amount of $O_3$/TEOS material that accumulates on the nitride mask regions of the protrusions decreases. This results in non-uniform coverage of the protrusions or even no coverage of the nitride mask regions of the protrusions. The invention overcomes this problem as well.

FIGS. 3–7 show an illustrative fabrication process according to the invention. A nitride layer 102, such as $Si_3N_4$, is deposited on an Si substrate 100, which is illustratively doped N type with As or P ions. (Of course, the substrate can also be doped P type with B ions). The nitride layer 102 is then patterned using a photo-lithographic process. In such a process, a photo-resist material is coated to the top surface of the nitride layer 102 and is exposed through a mask. The mask selectively passes light to some but not other portions of the photo-resist layer. Light that passes through the mask exposes regions 104 of the photo-resist material. The remaining nonexposed photo-resist material is then removed. Illustratively, the regions 104 have dimensions, and spacings, as small as permissible by the photo-lithographic resolution of the photo-lithographic process used to fabricate the semiconductor, within the spacing limits provided for each memory cell capacitor.

As shown in FIG. 4, the portions of the nitride surface not covered by a photon-resist region 104 are then vertically etched, for example, using $NF_3$, $CF_4$ or HBr as an etchant. This leaves nitride regions 106 having approximately the same dimensions as the photo-resist regions 104 that cover them. The photo-resist regions 104 are then removed.

As shown in FIG. 5, using the nitride regions 106 as a mask, the Si substrate 100 is then deeply etched using $NF_3$, $CF_4$ or HBr as an etchant. Illustratively, this forms protrusions 108, such as walls or pillars, separated by trenches 110. Illustratively, the trenches 110 are in the range of about 0.5 to 2.0 μm deep. Each protrusion 108 includes a nitride region 106 on top of a protruding mesa of Si having approximately the same cross-sectional dimensions and shape as the covering nitride region 106. Each protrusion 108 is separated from an adjacent protrusion by a surface portion 112 of the substrate 100. The surface portions 112 can also include part of a perimeter area of the substrate surface that surrounds the protrusions 108.

Next, as shown in FIG. 6, a first $O_x$/TEOS film 114 is deposited on the top and side surfaces of the protrusions 108 and the portions 112. This film 1 14 can be a thin, low pressure, e.g., 30–70 torr, $O_3$/TEOS film. Such a film 114 illustratively has a side thickness in the range of about 100 to 300 Å. Alternatively, the film 114 can be a PECVD (plasma enhanced chemical vapor deposition) $O_2$/TEOS film with a side thickness in the range of about 100 to 300 Å. Such a film 114 adheres to all of the protrusions 108, most notably, the nitride regions 106, and portions 112. Furthermore, the film 114 continuously covers the protrusions 108 and portions 112 with a relatively uniform thickness so that the film 114 conforms to the geometry (i.e., shape) of the protrusions 108 and portions 112.

Next, as shown in FIG. 7, a second $O_3$/TEOS film 116 is deposited on the film 114. This film 116 is preferably a high pressure, e.g., 200–600 torr, $O_3$/TEOS film. Illustratively, the film 116 has a side thickness in the range of about 100 to 1,000 Å. The film 116 also is continuous and has a relatively uniform thickness so that it conforms to the geometry of the underlying film 114, protrusions 108 and portions 112.

Normally, a high pressure $O_3$/TEOS film 116 will not adhere continuously or uniformly to a structure including Si and a nitride. However, a high pressure $O_3$/TEOS film 116 will uniformly and continuously adhere to another $O_x$/TEOS film. Thus, the thin oxide film 114 serves as a buffer layer which enables uniform coverage by the film 116. The film 114 is preferably thinner than the film 116. In any event, the film 116 provides a protective cover to the layer 114 which reduces water absorption and evaporation. The outer surface of the film 116 is also less porous than that of the film 114.

The above discussion is intended to illustrate the invention. Those having ordinary skill in the art may devise numerous alternative embodiments without departing from the spirit and scope of the following claims.

The claimed invention is:

1. A method of fabricating a semiconductor device comprising:

(a) forming one or more protrusions on a semiconductor surface, (b) forming a first $O_x$/TEOS film on top and side surface of said protrusions and surface are portions of said semiconductor surface separating said one or more protrusions from each other, if any, and (c) forming a second $O_3$/TEOS film on, and covering, said first film, wherein the first and second films are deposited at first and second pressures, respectively, wherein said second pressure is higher than said first pressure.

2. The method of claim 1 wherein said step (b) comprises the step of depositing a PECVD $O_2$/TEOS film as said first film.

3. The method of claim 1 wherein said step (c) further comprises the step of depositing said second film at a pressure in the range of about 200–600 torr.

4. The method of claim 3 further comprising the step of depositing said first film at a pressure in the range of about 30–70 torr.

5. The method of claim 1 where said step (a) further comprises the steps of:

(a1) forming a mask layer on said semiconductor layer, (a2) patterning said mask layer to form one or more mask regions, and (a3) vertically etching said semiconductor layer to form a protrusion below, and having approximately the same cross-section as, each of said mask regions.

6. The method of claim 1 wherein each of said protrusions comprises a nitride region with at least one exposed surface that is covered by said first film.

7. A method of fabricating a semiconductor device comprising;

(a) forming one or more protrusions on a semiconductor surface, (b) forming a first $O_x$/TEOS film on top and side of said protrusions and surface are portions of said semiconductor surface separating said one or more protrusions from each other, if any, (b1) depositing an $O_3$/TEOS film as said first film at a first pressure, (c) forming a second $O_3$/TEOS film on, and covering, said first film (c1) depositing said second film at a second pressure that is higher than said first pressure.

8. A method of fabricating a semiconductor device comprising:

(a) forming one or more protrusion on a semiconductor surface, (b) forming a first $O_x$/TEOS film on top and said surfaces of said protrusioons and surface are portions of said semiconductor surface separating said one or more protrusions from each other, if any, and (c) forming a second $O_3$/TEOS film on, and covering, said first film, wherein said first film is thinner than said second film.

* * * * *